United States Patent
Althaus et al.

(10) Patent No.: US 11,780,394 B2
(45) Date of Patent: Oct. 10, 2023

(54) CAPACITIVE DETECTION AND/OR CLASSIFICATION DEVICE AND OPERATION METHOD FOR HEATER MEMBER COMPENSATION, PARTICULARLY FOR AUTOMOTIVE APPLICATION

(71) Applicant: IEE INTERNATIONAL ELECTRONICS & ENGINEERING S.A., Echternach (LU)

(72) Inventors: Frank Althaus, Saarbrücken (DE); Andrej Mattheis, Trier (DE); Alain Strasser, Echternach (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 18/018,507

(22) PCT Filed: Jul. 27, 2021

(86) PCT No.: PCT/EP2021/071053
§ 371 (c)(1),
(2) Date: Jan. 27, 2023

(87) PCT Pub. No.: WO2022/023369
PCT Pub. Date: Feb. 3, 2022

(65) Prior Publication Data
US 2023/0219515 A1   Jul. 13, 2023

(30) Foreign Application Priority Data
Jul. 27, 2020  (LU) .................................. LU101953

(51) Int. Cl.
| | | |
|---|---|---|
| B60R 21/015 | (2006.01) | |
| H03K 17/96 | (2006.01) | |
| H03K 17/955 | (2006.01) | |

(52) U.S. Cl.
CPC .... B60R 21/0154 (2014.10); B60R 21/01532 (2014.10); H03K 17/955 (2013.01); H03K 17/962 (2013.01)

(58) Field of Classification Search
CPC .............. B60R 21/015; B60R 21/0154; B60R 21/01532; H03K 17/955; H03K 17/962;
(Continued)

(56) References Cited

U.S. PATENT DOCUMENTS

| 4,766,368 A | 8/1988 | Cox |
|---|---|---|
| 6,161,070 A | 12/2000 | Jinno et al. |

(Continued)

FOREIGN PATENT DOCUMENTS

| WO | 2014122197 A1 | 8/2014 |
|---|---|---|
| WO | 2017102386 A1 | 6/2017 |

(Continued)

OTHER PUBLICATIONS

J. R. Smith et al., Electric Field Sensing for Graphical Interfaces, IEEE Computer Graphics and Applications, 18(3): pp. 54-60, 1998.

*Primary Examiner* — Hai L Nguyen
(74) *Attorney, Agent, or Firm* — REISING ETHINGTON P.C.

(57) ABSTRACT

A capacitive detection device includes a capacitive sensor having a sense electrode and an auxiliary electrode that are arrangeable in the vicinity of an electric heater member for mutual capacitive coupling. The capacitive detection device has a signal voltage source providing an alternating measurement voltage, a complex impedance measurement circuit for measuring complex sense currents and for deter- (Continued)

mining a complex impedance based on the measured complex sense current, and for electrically connecting the auxiliary electrode either with the reference voltage or with the guard signal. The method includes providing the measurement signal to the sense electrode and electrically connect the auxiliary electrode selectively either to the reference voltage or to the guard voltage; determining capacitance values in the two different connection states of the auxiliary electrode; and calculating a compensated capacitance value as a weighted sum of the two determined capacitance values, wherein the weighting factors are predefined constant values.

11 Claims, 5 Drawing Sheets

(58) Field of Classification Search
CPC ........... B60L 1/02; G01R 27/00; G01R 27/02; G01D 5/24; G01D 5/2417
USPC .............. 307/10.1, 9.1; 219/217, 202, 217.2, 219/180.12, 217.3; 324/519, 548, 658, 324/686
See application file for complete search history.

(56) References Cited

U.S. PATENT DOCUMENTS

| | | | |
|---|---|---|---|
| 6,283,504 B1 | 9/2001 | Stanley et al. | |
| 6,392,542 B1 | 5/2002 | Stanley | |
| 6,563,231 B1 | 5/2003 | Stanley et al. | |
| 8,581,603 B2 | 11/2013 | Hwang | |
| 9,006,618 B2 * | 4/2015 | Lamesch | B60R 21/01532 |
| | | | 219/202 |
| 11,214,172 B2 * | 1/2022 | Althaus | G01N 27/223 |
| 2005/0253712 A1 | 11/2005 | Kimura et al. | |
| 2006/0219460 A1 | 10/2006 | Wanami | |
| 2007/0182553 A1 | 8/2007 | Kamizono et al. | |
| 2015/0367751 A1 | 12/2015 | Lamesch et al. | |
| 2018/0345894 A1 | 12/2018 | Althaus et al. | |
| 2020/0198498 A1 | 6/2020 | Althaus et al. | |
| 2021/0262838 A1 | 8/2021 | Anti et al. | |

FOREIGN PATENT DOCUMENTS

| | | |
|---|---|---|
| WO | 2018229263 A1 | 12/2018 |
| WO | 2019224291 A1 | 11/2019 |

* cited by examiner

CAPACITIVE DETECTION AND/OR CLASSIFICATION DEVICE AND OPERATION METHOD FOR HEATER MEMBER COMPENSATION, PARTICULARLY FOR AUTOMOTIVE APPLICATION

TECHNICAL FIELD

The present invention relates to a capacitive detection device with heater member compensation, in particular for automotive applications, a method of operating such capacitive detection device for heater member compensation, and a software module for automatically carrying out such method.

BACKGROUND

Capacitive sensors and capacitive measurement and/or detection devices employing capacitive sensors have a wide range of applications, and are among others used for the detection of the presence and/or the position of a conductive body or body portion in the vicinity of an antenna electrode. As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

In the field of automotive vehicle sensor application it is known to employ capacitive sensors for providing input to Automatic Driver Assistance Systems (ADAS), for instance for the purpose of a seat belt reminder (SBR) system or an activation control for an auxiliary restraint system (ARS). Sensed signals can serve as a basis for making decisions by an ADAS, for instance for a decision to deploy an air bag system to a specific vehicle seat or not.

Capacitive occupant sensing systems have been proposed in great variety, e.g. for controlling the deployment of one or more airbags, such as e.g. a driver airbag, a passenger airbag and/or a side airbag. U.S. Pat. No. 6,161,070, to Jinno et al., relates to a passenger detection system including a single antenna electrode mounted on a surface of a passenger seat in an automobile. An oscillator applies on oscillating voltage signal to the antenna electrode, whereby a minute electric field is produced around the antenna electrode. Jinno proposes detecting the presence or absence of a passenger in the seat based on the amplitude and the phase of the current flowing to the antenna electrode.

U.S. Pat. No. 6,392,542 to Stanley teaches an electric field sensor comprising an electrode mountable within a seat and operatively coupled to a sensing circuit, which applies to the electrode an oscillating or pulsed signal having a frequency "at most weakly responsive" to wetness of the seat. Stanley proposes to measure phase and amplitude of the current flowing to the electrode to detect an occupied or an empty seat and to compensate for seat wetness.

US 2007/0182553 A1 proposes an occupant detection system for detecting an occupant on a seat of a vehicle. The occupant detection system includes an antenna electrode in a seat bottom of the seat, and an electronic unit connected to the antenna electrode and the vehicle. The electronic unit applies a load current to the antenna electrode so as to generate a weak electric field, and detects a potential current passing through the antenna electrode. The electronic unit detects an occupant based on an impedance and a phase difference, which are based on the load current and the potential current.

From U.S. Pat. No. 8,581,603 B2 an occupant classifying device for an automobile is known. The occupant classifying device can detect an occupant sitting on a seat by a change in an electric field between first and second electrodes that is caused by the occupant sitting on the seat. The occupant classifying device includes a seat for an occupant to sit on, a first electrode disposed in the seat, a second electrode disposed in the seat, spaced apart from the first electrode, and forming an electric field between the first and second electrodes, and a current measuring device for measuring a variation in current value corresponding to changes in the electric field caused by the occupant sitting on the seat.

US 2005/0253712 A1 describes an occupant judgment device in an automotive vehicle and an occupant judgment method for accurately determining the size of an occupant, with a simple configuration wherein a plurality of electrodes are arranged on one layer, and that can eliminate errors due to the capacitance between an occupant and surrounding car-body metal parts or the like, and thus suppress erroneous determination. The occupant determination apparatus comprises a first sensor including a plurality of seat section electrodes arranged on a sitting section, and a first determination section. The first sensor section comprises a first seat section electrode, a reference electrode array, wherein second seat section electrodes are arranged separately in the X-direction, and another reference electrode array, wherein third seat section electrodes are arranged separately in the X-direction, wherein the first seat section electrode, and the reference electrode arrays are mutually separately arranged in the y-direction. The first determination section comprises an oscillator, a capacitance detecting section, which detects the current flowing through a seat section electrode in order to detect the capacitance, a switching circuit, which switches the connection of the capacitance detecting section to the seat section electrode, and a controlling section, which outputs a switch control signal.

U.S. Pat. No. 6,283,504 B1 proposes an occupant sensor, wherein an electric field sensor comprises at least one electrode mountable in a vehicle seat and a sensing circuit operatively coupled to the electrode. The at least one electrode at least partially bounds at least one region that is proximate to an object such as an infant seat, a child seat, or a booster seat, for which the sensitivity of the sensor is preferably reduced. The at least one region without a conductive electrode may comprise a plurality of regions, and at least one of the regions may extend laterally across the seat. Furthermore, a plurality of electrodes may be incorporated, each having a different sensitivity to particular objects to be sensed, wherein an overall capacitance measurement that is dominated by the capacitance of the particular electrode that is most sensitive to the particular object can be used to indicate the presence of that object.

U.S. Pat. No. 6,563,231 B1 describes an occupant sensor that includes an electric field sensor comprising a plurality of first electrodes mountable within a vehicle seat, wherein the plurality of first electrodes are disposed on a common surface and are non-overlapping with one another. The electric field sensor further comprises at least one second electrode, wherein the first and second electrodes are proximate to one another. A sensing circuit is operatively coupled to the first and second electrodes so as to control the level of capacitance between an occupant on the vehicle seat and the circuit ground. In a second aspect, the electric field sensor incorporates a lattice electrode with a ground plane. In a third aspect, the electric field sensor incorporates a receive electrode that receives a signal from a sensing electrode for purposes of mitigating the effects of a seat wetting condition.

WO 2019/224291 A1 proposes a method of operating a capacitive measurement system for compensation of temperature influence. The capacitive measurement system includes at least one capacitive sensor member in an installed state and a capacitive measurement circuit for determining a complex impedance of an unknown capacitance from a complex sense current through the at least one capacitive sensor member. In the method, a calibration measurement is carried out to obtain temperature characteristics of both the real part and the imaginary part of determined impedances. In following impedance measurements of the unknown capacitance at a current temperature $T_{curr}$, the real part and the imaginary part of the measured impedance is determined, and based on the real part determined at the current temperature $T_{curr}$ and the determined temperature characteristics of both the real part and the imaginary part, the imaginary part of the impedance determined at the current temperature $T_{curr}$ is corrected.

WO 2018/229263 A1 describes a capacitive sensing device for a seat occupancy detection, a classification system and a method for reducing an impact of the sensor-to-object impedance $Z_{SO}$ on an object-to-ground impedance $Z_{OG}$ measurement that the system performs.

The capacitive sensing device comprises a capacitive sensor that includes at least a first electrically conductive antenna electrode and at least a second electrically conductive antenna electrode that are mutually galvanically separate from each other; an impedance measurement circuit comprising at least one signal voltage source that is configured for providing, with reference to a ground potential, a periodic electrical measurement signal at an output port, and at least one sense current measurement means that is configured to measure complex sense currents with reference to a reference voltage. The impedance measurement circuit is configured and electrically connected to the capacitive sensor such that both the first antenna electrode and the second antenna electrode are electrically connectable to the output port for receiving the periodic electrical measurement signal and that at least one of the first and second antenna electrode is alternately electrically connectable to the ground potential. A complex sense current is being generated by the provided periodic electrical measurement signal in each one of the antenna electrodes that is connected to the output port. A signal processing unit is configured to determine, with reference to the ground potential, a complex impedance of at least one of the two antenna electrodes from a measured complex sense current through the respective antenna electrode with the first antenna electrode being electrically connected to the output port, to determine a complex impedance between the two antenna electrodes from individually measured complex sense currents through each of the two antenna electrodes with one of the first and second antenna electrode being electrically connected to the ground potential, and to provide output signals that are representative of the determined complex impedances.

As one effect of combining both impedance measurement results, the proposed system is able to determine the object-to-ground impedance $Z_{OG}$ completely independent from wear of ISOIX anchorages or human objects touching the electric ground of the vehicle, thus ensuring a stable classification of the object over the entire vehicle lifetime.

From WO 2014/122197 A1 a capacitive sensor for a vehicle seat is known that comprises an antenna electrode for being arranged in the vehicle seat and a control and evaluation circuit operatively connected to the antenna electrode. The control and evaluation circuit is configured to operate in a first mode of operation, during which it measures alternating electrical current flowing between the antenna electrode and ground. The capacitive sensor comprises a seat frame connector for connecting the control and evaluation circuit to the seat frame of the vehicle seat. The control and evaluation circuit is configured to operate in a second mode of operation, during which it measures electrical current flowing into the seat frame connector. A switching device is provided for connecting the seat frame connector alternatively to ground or to the reference input of a transimpedance amplifier. By measuring the electrical current flowing into the seat frame connector, it is possible to check whether the seat frame has its own connection to ground.

Another example for the use of capacitive sensors in an automotive vehicle application is the so-called Hands Off Detection (HOD) system, in which one or more sensors provide information about whether a driver has his hands on a steering wheel of a vehicle or not. This information can be transferred to an ADAS such as an Adaptive Cruise Control (ACC), which, based on the provided sensor signal, can alert the driver and remind him or her to take control of the steering wheel again. In particular, such HOD systems can be used in support to fulfill a requirement of the Vienna convention that the driver must remain in control of the vehicle at all times. HOD systems may as well be employed in a parking assistance system or an ADAS that is configured for evaluating a driver activity at high speed.

In some (so-called "loading mode") capacitive sensors, the at least one antenna electrode serve at the same time as sensing electrode. In this case, a measurement circuit determines a current flowing into the at least one antenna electrode in response to an oscillating voltage being applied to them. The relationship of voltage to current yields the complex impedance between the at least one antenna electrode and ground potential. In an alternative version of capacitive sensors ("coupling mode" capacitive sensors), the transmitting antenna electrode(s) and the sensing electrode(s) are separate from one another. In this case, the measurement circuit determines a current or voltage that is induced in the sensing electrode when at least one transmitting antenna electrode is being operated.

Different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998, which shall hereby be incorporated by reference in its entirety with effect for the jurisdictions permitting incorporation by reference.

The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may, for instance, be determined by applying an alternating voltage signal to an antenna electrode and by measuring the current flowing from that antenna electrode either towards ground (in the loading mode) or into a second antenna electrode (in the coupling mode). This current may be measured by a transimpedance amplifier, which is connected to the sensing electrode and which converts the current flowing into the sensing electrode into a voltage proportional to this current.

Some capacitive sensors are designed as sense-only capacitive sensors having a single sense electrode. Also, quite often capacitive sensors are used that comprise a sense electrode and a so-called "guard electrode" that are proximally arranged and mutually insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

For this purpose, it is known to arrange a guard electrode between sense electrodes of a capacitive sensor and a vehicle seat heater member or a vehicle steering wheel heater member. As heater members, for instance heater wires, in many cases are electrically connected to vehicle ground they may have a large effect on a capacitive sensor signal to be measured. Consequently, malfunctions such as a broken heater wire (double break) or a disconnected heater member can have an impact on the measurement such that any detection and/or misclassification cannot be excluded. Use of a guard electrode as a second layer underneath the sense electrode can avoid a direct coupling between the sense electrode and a heater member and can therefore at least mitigate the heater malfunction impact on the detecting and/or classification capability of a capacitive sensor system.

Arrangement of an extra guard electrode between a sense electrode of a capacitive sensor and a heater member, for instance for vehicle seat or vehicle steering wheel applications, means additional effort in terms of hardware and installation. Further, care must be taken to ensure the stable positioning of the guard electrode over the lifetime of the capacitive sensor.

SUMMARY

It is therefore an object of the invention to provide a capacitive sensing device, in particular for vehicle seat occupancy detection or Hands Off Detection (HOD) in a vehicle whose seat and/or steering wheel are equipped with at least one heater member, respectively. The capacitive sensing device should have a simplified design and should particularly show a robust seat occupancy detection or HOD capability, which is as unaffected as possible particularly by any change of a connection status of any heater member of a respective vehicle seat or vehicle steering wheel.

In one aspect of the present invention, the object is achieved by a capacitive detection device that is configured to execute steps of a method disclosed herein. The capacitive detection device comprises at least one capacitive sensor, a signal voltage source, a complex impedance measurement circuit and a control and evaluation unit.

The at least one capacitive sensor includes at least one electrically conductive sense electrode and at least one electrically conductive auxiliary electrode that are proximal arranged to and mutually insulated from each other. The at least one sense electrode and the at least one auxiliary electrode are arrangeable in the vicinity of a heater member. The heater member may, without being limited to, be part of an electrically heatable seat, in particular vehicle seat, or part of an electrically heatable vehicle steering wheel.

The signal voltage source is configured for providing an alternating measurement voltage with reference to a reference voltage at at least one output port, configured to serve as a measurement signal to be provided to the at least one sense electrode, and a guard signal selectively to be provided to the at least one auxiliary electrode.

The complex impedance measurement circuit is electrically connected to the at least one output port, to the at least one sense electrode and to the at least one auxiliary electrode for measuring complex sense currents generated in the at least one sense electrode. The complex impedance measurement circuit is configured for determining a complex impedance based on the measured complex sense current, and is further configured to operatively and selectively electrically connect the at least one auxiliary electrode either with the reference voltage or with the guard signal. That is, in case of a capacitance measurement to be taken, the at least one sense electrode is provided with the measurement voltage, while the at least one auxiliary electrode is provided either with the reference voltage, which may be an AC ground potential, or with the guard signal of the signal voltage source.

The control and evaluation unit is connected to the complex impedance measurement circuit for receiving data signals. The control and evaluation unit is at least configured to control the complex impedance measurement circuit to carry out a complex impedance measurement.

The phrases "configured for" and "configured to", as used in this application, shall in particular be understood as being specifically programmed, laid out, furnished or arranged.

The proposed capacitive detection device can be used for at least partially compensating an effect of any change of a connection status of the heater member in whose vicinity the at least one sense electrode and the at least one accessory electrode are arrangeable. As will be explained below, the selective electrically connection of the at least one auxiliary electrode either with the reference voltage or with the guard signal allows for combining loading mode and coupling mode measurements to a combined signal, which is at least less susceptible, if not completely unaffected, to changes of the connection status of the heater member.

The capacitive detection device is in particular beneficial in automotive applications, for instance in seat occupancy detection or Hands Off Detection (HOD) devices. The term "automotive", as used in this patent application, shall particularly be understood as being suitable for use in vehicles including passenger cars, trucks, semi-trailer trucks and buses.

It is further contemplated that the signals from the capacitive detection device can further be evaluated for classification purposes. For instance, in case of an application of the capacitive detection device for vehicle seat occupancy detection, classification can be established by incorporating a threshold value or thresholds values for distinguishing between different occupancy classes.

Preferably, the capacitive detection device includes a remotely controllable switching unit for operatively and selectively electrically connecting the at least one auxiliary electrode either with the reference voltage or the guard signal. The remotely controllable switching unit may include a plurality of ports and a plurality of switching members that are configured, by control of the switching unit, to operatively and selectively provide electrical connections between selected ports.

Preferably, the control and evaluation unit of the capacitive detection device is configured to execute steps of the method disclosed herein. Further, the control and evaluation unit is configured for controlling a remotely controllable switching unit for operatively and selectively electrically connecting the at least one auxiliary electrode either with the reference voltage or the guard signal.

In preferred embodiments of the capacitive detection device, the control and evaluation unit comprises a microcontroller that includes a digital data memory unit, a processor unit with data access to the digital data memory unit, and a control interface. Such equipped microcontrollers are commercially available nowadays in many variations and at economic prices. In this way, an automated operation of the capacitive detection device can be enabled.

In preferred embodiments of the capacitive detection device, the at least one sense electrode and the at least one auxiliary electrode are arranged in a coplanar manner. This design can enable a compact embodiment, which is particularly beneficial in tight space configurations.

Preferably, the at least one auxiliary electrode surrounds the major portion of the at least one sense electrode. The term "major portion", as used in this application, shall particularly be understood as equal to or more than 50%, more preferably more than 70%, and, most preferably, more than 80% of a footprint area of the at least one sense electrode, and shall also encompass the case of a portion of 100%, i.e. that the auxiliary electrode completely surrounds the at least one sense electrode.

In this way, on the one hand an effective capacitive coupling between the at least one sense electrode and the at least one auxiliary electrode can be achieved. On the other hand, also an effective capacitive coupling between both the at least one sensor electrode and the at least one auxiliary electrode and the at least one heater member, respectively, can be enabled. The effective respective capacitive couplings can reduce requirements regarding precision of measurement for combining loading mode and coupling mode measurements to the combined signal, which is less susceptible to changes of the connection status of the heater member.

In preferred embodiments of the capacitive detection device, the at least one sense electrode has a generally rectangular shape and the at least one auxiliary electrode is designed in the shape of a band and is arranged to run along a major portion of a circumferential length of the at least one sense electrode, in a constantly spaced manner to the at least one sense electrode.

This design can enable an especially compact embodiment that is beneficial for application in tight space configurations, providing effective mutual capacitive couplings among the at least one sensor electrode, the at least one auxiliary electrode and a heater member.

In further preferred such embodiments, the at least one sense electrode and the at least one auxiliary electrode are arrangeable with respect to a heater member in the vicinity of the heater member such that, seen in at least one direction, at least one portion of the heater member extends across the band shape of the at least one auxiliary electrode to overlap it and further extends over the at least one sense electrode to a substantial part of a linear dimension of the at least one sense electrode.

The term "substantial part", as used in this application, shall particularly be understood a portion of equal to or more than 20%, more preferably more than 30%, and, most preferably, more than 50% of a linear dimension of the at least one sense electrode. In this way, an effective capacitive coupling between each of the at least one sensor electrode and the at least one auxiliary electrode and the heater member can readily be provided. In a possible embodiment, the at least one portion of the heater member extends across the band shape of the auxiliary electrode and further completely extends across the width of the sense electrode. It will be appreciated that such an embodiment is particularly insensitive to positioning tolerances between the electric heater member and the electrodes of the capacitive sensor and therefore particularly robust versus such positioning tolerances.

Preferably, the at least one direction is arranged perpendicular to a plane, in which the at least one sensor electrode and the at least one auxiliary electrode are disposed.

In another aspect of the present invention, a seat occupancy detection system for detecting an occupancy of an electrically heatable seat, in particular a vehicle seat, is provided. The seat occupancy detection system comprises at least one heater member and an embodiment of the capacitive detection device disclosed herein. The at least one heater member is arranged a cushion or backrest forming part of the seat. The at least one sense electrode and the at least one auxiliary electrode are arranged in the vicinity of the heater member. The benefits described in context with the capacitive detection device apply to the proposed seat occupancy detection system to the full extent.

In yet another aspect of the present invention, a hands-off detection device for an electrically heatable steering wheel is provided. The hands-off detection device comprises at least one heater member and an embodiment of the capacitive detection device disclosed herein. The at least one heater member is arranged on a rim of the steering wheel. The at least one sense electrode and the at least one auxiliary electrode are arranged in the vicinity of the heater member. The benefits described in context with the capacitive detection device apply to the proposed hands-off detection device to the full extent.

Preferably, at least one heater member of the seat occupancy detection system or the hands-off detection device is arranged such that, seen in at least one direction, at least one portion of the heater member extends across the at least one auxiliary electrode to overlap it and further extends over the at least one sense electrode to a substantial part of a linear dimension of the at least one sense electrode. In this way, an effective capacitive coupling between each of the at least one sensor electrode and the at least one auxiliary electrode and the heater member of the seat occupancy detection system and the hands-off detection device, respectively, can readily be provided. In a preferred embodiment, the at least one portion of the hearter member extends across the band shape of the auxiliary electrode and further completely extends across the width of the sense electrode. It will be appreciated that such an embodiment is particularly insensitive to positioning tolerances between the electric heater member and the electrodes of the capacitive sensor and therefore particularly robust versus such positioning tolerances.

It is another object of the invention to provide a method of operating the capacitive detection device as disclosed herein for heater member compensation. The method comprises at least the following steps:

provide the measurement signal to the at least one sense electrode and electrically connect the at least one auxiliary electrode to the reference voltage, determine a complex electric current flowing through the at least one sense electrode, calculate a complex impedance using the determined complex electric current and derive a capacitance value as an emit mode capacitance value, electrically disconnect the at least one auxiliary electrode from the reference voltage, electrically connect the at least one auxiliary electrode to the guard voltage, determine a complex electric current flowing through the at least one sense electrode, calculate a complex impedance using the determined complex electric current and derive a capacitance value as a guard mode capacitance value, calculate the difference between the guard mode capacitance value and the emit mode capacitance value as a differential loading mode capacitance value, and calculate a compensated capacitance value as a weighted sum of the emit mode capacitance value and the differential loading mode capacitance value, wherein the weighting factors are predefined constant values.

The proposed method of operating the capacitive detection device can at least partially compensate an effect of any change of a connection status of the heater member in whose vicinity the at least one sense electrode and the at least one accessory electrode are arrangeable.

It goes without saying that the proposed method can also be executed in a different sequence of electrically connecting the at least one auxiliary electrode firstly to the guard voltage and then to the reference voltage.

FIG. 2 shows an equivalent circuit diagram of a configuration of a sense electrode 16 and an auxiliary electrode 18 arranged in the vicinity of a heater member 40. The heater member 40 may be installed in an electrically heatable vehicle seat. The sense electrode 16 and the auxiliary electrode 18 are mutually electrically insulated and form a capacitor 44 whose capacitance is denoted as $C_{SE}$. Further, a capacitor 46 of capacitance $C_{SSH}$ is formed by the sense electrode 16 and the heater member 40, and a capacitor 48 of capacitance $C_{ESH}$ is formed by the auxiliary electrode 18 and the heater member 40.

Under regular operating conditions, the heater member 40 of the electrically heatable vehicle seat is connected to a reference voltage 24 given by the ground potential, which usually is provided by an electrical connection with the vehicle chassis potential.

The emit mode capacitance value $C_{EMIT}{}^G$, determined with the auxiliary electrode 18 being connected to ground potential, is then given by the parallel connection of capacitor 44 and capacitor 46:

$$C_{EMIT}{}^G = C_{SE} + C_{SSH},$$

the upper index 'G' denoting the grounding condition of the heater member 40.

With the auxiliary electrode 18 being connected to guard potential, the capacitor 44 formed by the sense electrode 16 and the auxiliary electrode 18 with capacitance $C_{SE}$ is ineffective in the coupling mode, and guard mode capacitance value $C_{GUARD}{}^G$ equals $C_{SSH}$, the capacitance between the sense electrode 16 and the heater member 40, which is kept at ground potential.

The differential loading mode capacitance value $C_{DLM}{}^G$ is then given as $$C_{DLM}{}^G = C_{EMIT}{}^G - C_{GUARD}{}^G = C_{EMIT}{}^G - C_{SSH} = C_{SE}$$

When the electrical connection status of the heater member 40 changes to floating potential condition (indicated in FIG. 2 by an open switch symbol), due to connection failure or by design intention, the emit mode capacitance value $C_{EMIT}{}^G$ changes to $C_{EMIT}{}^F$, the upper index 'F' denoting the floating condition of the heater member 40.

At this electrical connection status of the heater member 40, the capacitance $C_{EMIT}{}^F$ is determined by the capacitor 44 of capacitance $C_{SE}$ being connected in parallel to a series connection of capacitor 46 with capacitance $C_{SSH}$ and a parallel connection of capacitor 50 and capacitor 48 with capacitances $C_{SHG}$ and $C_{ESH}$, respectively, wherein $C_{SHG}$ denotes the capacitance value of the capacitor 50 formed by the heater member 40 and ground potential.

The emit mode capacitance value $C_{EMIT}{}^F$ for the floating condition of the heater member 40 and the auxiliary electrode 18 being connected to ground potential then becomes $$C_{EMIT}{}^F = C_{SE} + [C_{SSH}|(C_{SHG} + C_{ESH})]$$

wherein the symbol '|' represents a series connection.

With the auxiliary electrode 18 being connected to guard potential and the heater member 40 at floating condition, guard mode capacitance value $C_{GUARD}{}^F$ is determined by the capacitor 50 with capacitance $C_{SHG}$, which is connected in series to a parallel configuration of the capacitor 46 and the capacitor 48 formed by the sense electrode 16 and the auxiliary electrode 18 to the heater member 40, respectively, i.e. to capacitances $C_{SSH}$ and $C_{ESH}$.

The differential loading mode capacitance value $C_{DLM}{}^F$ changes to $$C_{DLM}^F = C_{EMIT}^F - C_{GUARD}^F = C_{EMIT}^F - [C_{SHG}|(C_{SSH} + C_{ESH})] \cdot \frac{C_{SSH}}{C_{SSH} + C_{ESH}}$$

wherein the fractional term accounts for the division of the electrical current between the capacitor 46 of capacitance $C_{SSH}$ and the capacitor 48 of capacitance $C_{ESH}$.

The compensated capacitance value is defined as a weighted sum of the emit mode capacitance value and the differential loading mode capacitance value. If the heater member 40 is connected to reference voltage 24, i.e. the ground potential, the compensated capacitance value is $$C_{EMIT}{}^G + \alpha \cdot C_{DLM}{}^G,$$

and with the heater member 40 at floating potential condition, the compensated capacitance value is $$C_{EMIT}{}^F + \alpha \cdot C_{DLM}{}^F.$$

Ideally, the difference of the two compensated capacitance values is equal to zero, reflecting that the measurement of the capacitance detection device is not influenced at all by the electric connection status of the heater member 40:

$$(C_{EMIT}{}^G + \alpha \cdot C_{DLM}{}^G) - (C_{EMIT}{}^F + \alpha \cdot C_{DLM}{}^F) \stackrel{!}{=} 0$$

Solving for α yields $$\alpha = \frac{C_{SSH}}{C_{ESH}}$$

Thus, by using a weighting factor for the emit mode capacitance value of 1.0 and a weighting factor for the differential loading mode capacitance value of a, the compensated capacitance value is at least less susceptible, if not completely unaffected, to changes of the connection status of the heater member 40.

As will be obvious to those skilled in the art, the weighting factor α is determined by the geometry and mutual configuration of the sense electrode 16, the auxiliary electrode 18 and the heater member 40.

Preferably, the weighting factor for the emit mode capacitance value equals one, and the weighting factor α for the differential loading mode capacitance value is proportional to a ratio of a value of a capacitance between the at least one sense electrode and an electric heater member and the value of a capacitance between the at least one auxiliary electrode and the electric heater member.

The proportionality factor α depends on the area of the sense electrode and the auxiliary electrode. In a typical setting where the area of the sense electrode is larger than the area of the auxiliary electrode, the factor alpha a is between 1 and 3. The skilled person will however understand that in other embodiments of the capacitance detection device the factor α may also be chosen to be smaller than one. As an example, the proportionality factor may be chosen to be 0.7. In this way, an improved overall performance robustness can be achieved for the capacitive detection device for specific applications.

It will be appreciated that the above description of the operation uses the differential loading mode DLM in order to determine the coupling between both electrodes. While this DLM mode is preferred for determining the coupling, it will be appreciated that coupling could as well be determined by measuring the receiving current at the auxiliary electrode. The principle would remain exactly the same and the computation as well. Only the determination of the $C_{DLM}$ values would be different (derived from received current).

In particular in automotive applications, the proposed method of operating the capacitive detection device shows an additional benefit. Namely, the calculated compensated capacitance value is not only less susceptible to changes of the connection status of the at least one heater member but also to that of other metal parts, for instance parts of a vehicle seat, which may change their electrical connection to a vehicle ground potential during driving. Examples for such parts are a seat pan or a frame structure, whose mechanical connection may change during driving due to vibrations or other load changes in the vehicle seat, resulting in changes of the electrical connection to the vehicle ground potential. Another important example is the widely used ISOFIX child seat restraint system. A detection and/or classification robustness of the proposed capacitive detection device can be improved by the increased mitigation of an effect of changes of the electrical connection of vehicle seat parts during driving.

It is further contemplated that the method of operating the capacitive detection device further comprises the steps of evaluating signals from the capacitive detection device for classification purposes.

In yet another aspect of the invention, a software module for controlling an automatic execution of steps of any embodiment of the method disclosed herein is provided.

The method steps to be conducted are converted into a program code of the software module, wherein the program code is implementable in a non-transitory, computer-readable medium or other digital memory unit of the capacitive detection device and is executable by a processor unit of the capacitive detection device. Preferably, the digital memory unit and/or processor unit may be a digital memory unit and/or a processing unit of the control and evaluation unit of the capacitive detection device. The processor unit may, alternatively or supplementary, also be another processor unit that is especially assigned to execute at least some of the method steps.

The software module can enable an automatic, robust and reliable execution of the method and can allow for a fast modification of method steps.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies embodiments of the invention in particular in connection with the figures.

BRIEF DESCRIPTION OF THE DRAWINGS

Further details and advantages of the present invention will be apparent from the following detailed description of not limiting embodiments with reference to the attached drawing, wherein.

In the different figures, the same parts are always provided with the same reference symbols or numerals, respectively. Thus, they are usually only described once.

DETAILED DESCRIPTION

Figure 1:
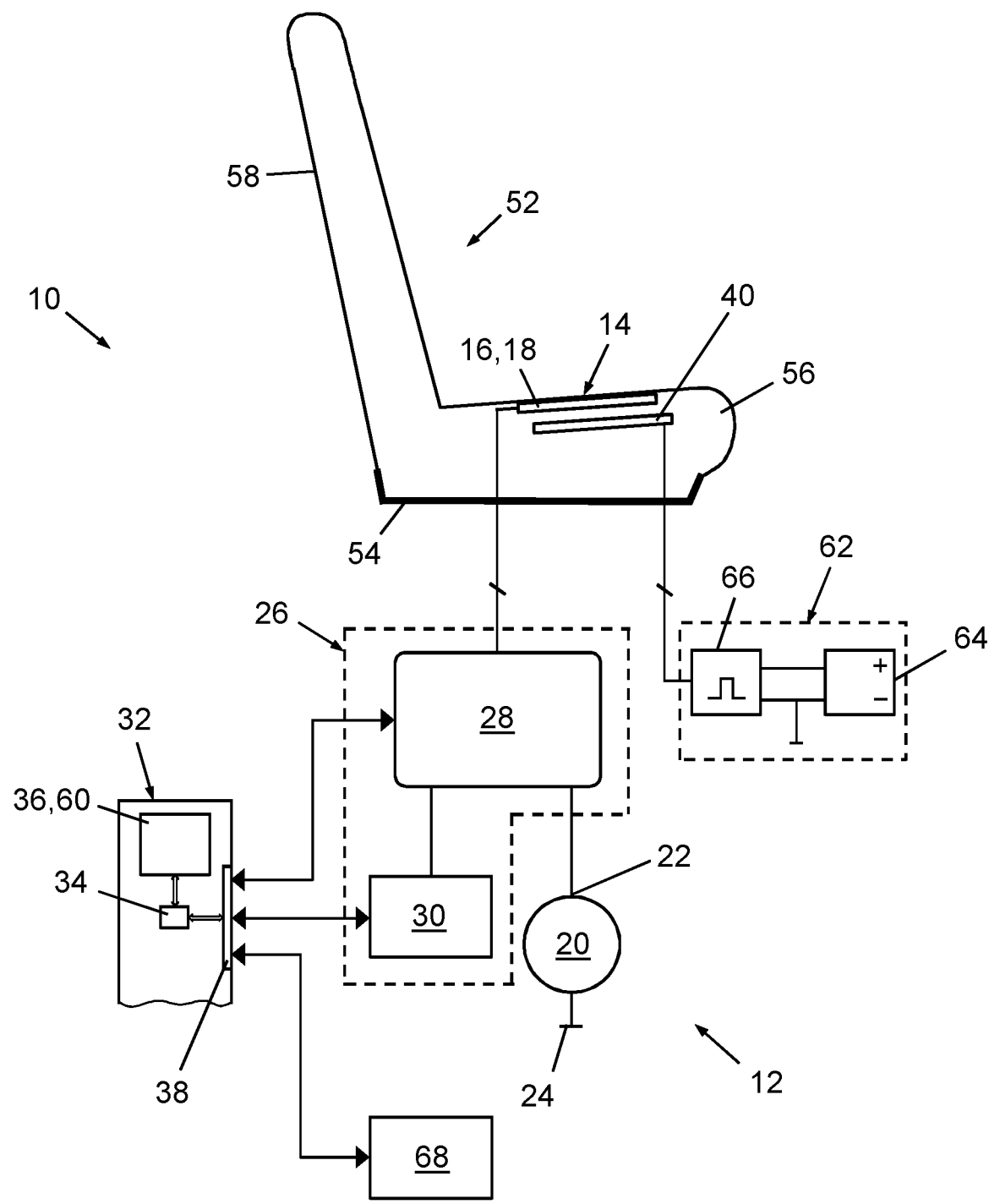
FIG. 1 schematically illustrates a seat equipped with a seat occupancy detection system comprising a possible embodiment of a capacitive sensing device in accordance with an embodiment of the invention, in an installed state.
Figure 2:
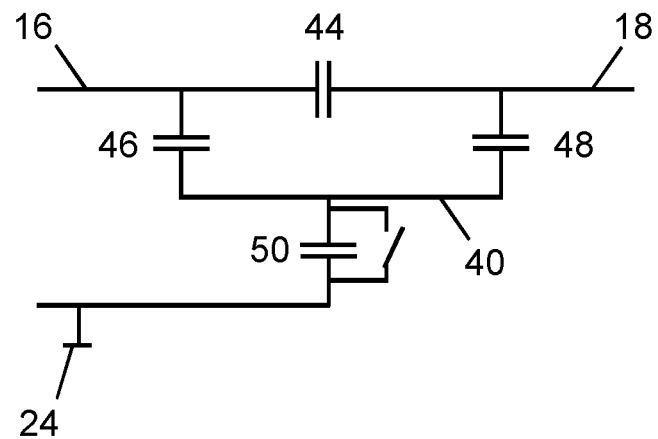
FIG. 2 shows an equivalent circuit diagram of a configuration of the sense electrode and the auxiliary electrode of the capacitive detection system pursuant to FIG. 1 arranged in the vicinity of the heater member of the seat, FIG. 3 schematically shows a detailed view of the sense electrode and the auxiliary electrode of the capacitive detection system pursuant to FIG. 1.

FIG. 1 schematically shows an electrically heatable seat 52 equipped with a seat occupancy detection system 10 comprising a possible embodiment of a capacitive detection device 12 in accordance with an embodiment of the invention, in an installed state and in a side view. The seat 52 is designed as a vehicle seat of a passenger car and includes a seat structure (not shown) by which it is erected on a passenger cabin floor of the passenger car, as is well known in the art.

The seat 52 further includes a seat base 54 supported by the seat structure and configured for receiving a seat cushion 56 for providing comfort to a seat occupant. The seat cushion 56 of the vehicle seat 52 comprises a seat foam member and a fabric cover, which has been omitted in FIG. 1. The seat base 54 and the seat cushion 56 are provided for supporting a bottom of the seat occupant. A backrest 58 of the seat 52 is provided for supporting a back of the seat occupant.

The seat occupancy detection system 10 is configured for detecting an occupancy of the electrically heatable seat 52, and further comprises an electric heater member 40 and an electric heater power unit 62 with a heating power source 64, which in this specific embodiment is fed by a starter battery of the vehicle.

Moreover, the electric heater power unit 62 comprises a controllable pulse-width modulation (PWM) switching unit 66 for controlling a provision of electric heating power to the electric heater member 40. The provision of electric heating power from the heating power source 64 is controllable by an electronic control unit (not shown) via the PWM switching unit 66. A typical switching frequency of a PWM scheme may be, for example, 25 Hz.

The capacitive detection device 12 includes a capacitive sensor 14 comprising an electrically conductive sense electrode 16 and an electrically conductive auxiliary electrode 18. The sense electrode 16 and the auxiliary electrode 18 are mutually galvanically separated and insulated from each other such that the only electrical connection between them is provided by capacitive coupling.

The electrically conductive sense electrode 16 and the electrically conductive auxiliary electrode 18 are located on the A-surface of the seat cushion 56, underneath the fabric cover. The sense electrode 16 and the auxiliary electrode 18 are arranged substantially parallel to the A-surface and are arranged above and in the vicinity of the electric heater member 40. In contrast to other conventional capacitive detection devices, the capacitive detection device 12 does not include an extra guard electrode disposed between the sense electrode 16 and the electric heater member 40.

Figure 3:
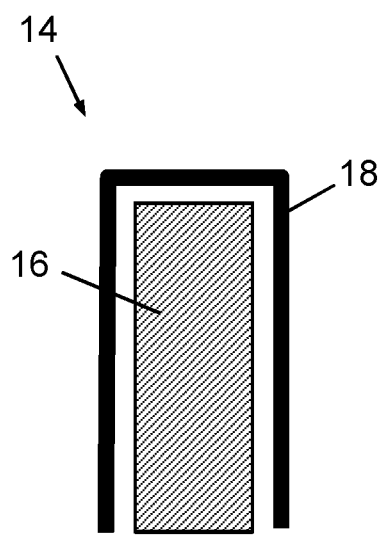

FIG. 3 schematically shows a detailed view of the sense electrode 16 and the auxiliary electrode 18 of the capacitive detection device 12 pursuant to FIG. 1. The sense electrode 16 and the auxiliary electrode 18 are arranged in a coplanar manner and may be formed as printed metal electrodes attached on a flexible film carrier. The sense electrode 16 has a rectangular shape, and the auxiliary electrode 18 is designed in the shape of a band. The auxiliary electrode 18 is arranged to run along a major portion of a circumferential length of the sense electrode 16, in a constantly spaced manner to the sense electrode 16. In this way, the auxiliary electrode 18 is laid out to surround a major portion of the sense electrode 16.

Figure 4:
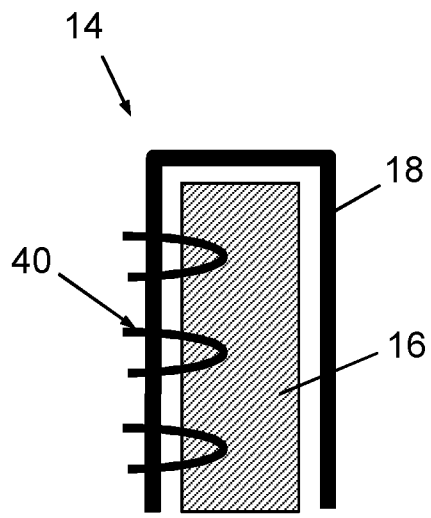
FIG. 4 schematically shows a possible arrangement of the sense electrode and the auxiliary electrode of the capacitive detection system pursuant to FIG. 1 in the vicinity of the heater member of the seat, FIG. 5 schematically shows another possible arrangement of the sense electrode and the auxiliary electrode of the capacitive detection system pursuant to FIG. 1 in the vicinity of an alternative embodiment of the heater member of the seat.

As is schematically illustrated in FIG. 4, the sense electrode 16 and the auxiliary electrode 18 are arranged with respect to the electric heater member 40 in the vicinity of the electric heater member 40 such that, seen in a direction perpendicular to the common plane, portions of the electric heater member 40 overlap and extend across the band shape of the auxiliary electrode 18 and further extend over the sense electrode 16 to a substantial part of a linear dimension, namely the width, of the sense electrode 16.

Figure 5:
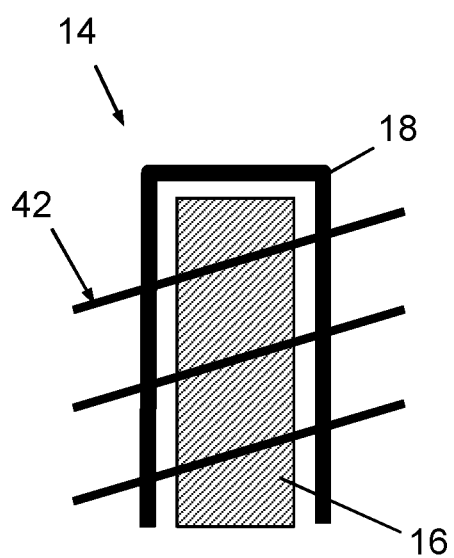

In other embodiments, an example of which is schematically illustrated in FIG. 5, the sense electrode 16 and the auxiliary electrode 18 may be arranged with respect to an electric heater member 42 in the vicinity of the electric heater member 42 such that, seen in the direction perpendicular to the common plane, portions of the electric heater member 42 overlap and extend across the band shape of the auxiliary electrode 18 and further completely extend across the width of the sense electrode 16. It will be appreciated that this embodiment is particularly insensitive to positioning tolerances between the electric heater member 42 and the electrodes 16 and 18 of the capacitive sensor and therefore particularly robust versus such positioning tolerances.

Referring again to FIG. 1, besides the capacitive sensor 14, the capacitive detection device 12 further includes a signal voltage source 20, a complex impedance measurement circuit 26 including a remotely-controllable switching unit 28 and a current measurement circuit 30, and a control and evaluation unit 32.

The signal voltage source 20 is configured for providing an alternating and, more specifically, a periodic measurement voltage with reference to a reference voltage 24, namely an AC ground potential, at an output port 22. In this specific embodiment, the signal voltage source 20 provides a sinusoidal periodic electrical measurement voltage with a fundamental frequency of e.g. 2 MHz. In general, the fundamental frequency may typically lie in a range between 10 kHz and 100 MHz. The output port 22 of the signal voltage source 20 is electrically connected to the remotely-controllable switching unit 28. The alternating measurement voltage is configured to serve as a measurement signal to be provided to the sense electrode 16 and as a guard signal selectively to be provided to the auxiliary electrode 18. Electronic circuits for providing the guard signal based on the alternating measurement voltage and with essentially the same frequency and appropriate amplitude and phase are known in the art and need not be discussed in more detail herein.

The complex impedance measurement circuit 26 is electrically connected to the output port 22 of the signal voltage source 20, to the sense electrode 16 and to the auxiliary electrode 18 and is configured for measuring complex sense currents generated in the sense electrode 16, and for determining a complex impedance based on the measured complex sense current. The complex impedance measurement circuit 26 includes the remotely-controllable switching unit 28 to be configured to operatively and selectively electrically connect the auxiliary electrode 18 either with the reference voltage 24 or with the guard signal. The current measurement circuit 30 of the complex impedance measurement circuit 26 comprises sense current measurement means that may for instance include at least one transimpedance amplifier.

The control and evaluation unit 32 is connected to the complex impedance measurement circuit 26 for receiving and evaluating data signals. The control and evaluation unit 32 is configured to control the complex impedance measurement circuit 26 to carry out a complex impedance measurement. To this end, the control and evaluation unit 32 comprises a microcontroller that includes a processor unit 34, a digital data memory unit 36 to which the processor unit 34 has data access, and a control interface 38. Control and signal lines from the control interface 38, respectively, are provided to connect the control and evaluation unit 32 with the remotely-controllable switching unit 28 and the current measurement circuit 30. Another signal line is provided to connect the control and evaluation unit 32 to an airbag control unit 68 of the vehicle.

Although the proposed capacitive detection device has been described as part of a seat occupancy detection system, those skilled in the art will readily acknowledge that the capacitive detection device can as well be used in a hands-off detection (HOD) device for an electrically heatable steering wheel, wherein an electric heater member is arranged on the rim of the steering wheel, and the sense electrode and the auxiliary electrode are arranged in the vicinity of the electric heater member.

Figure 8:
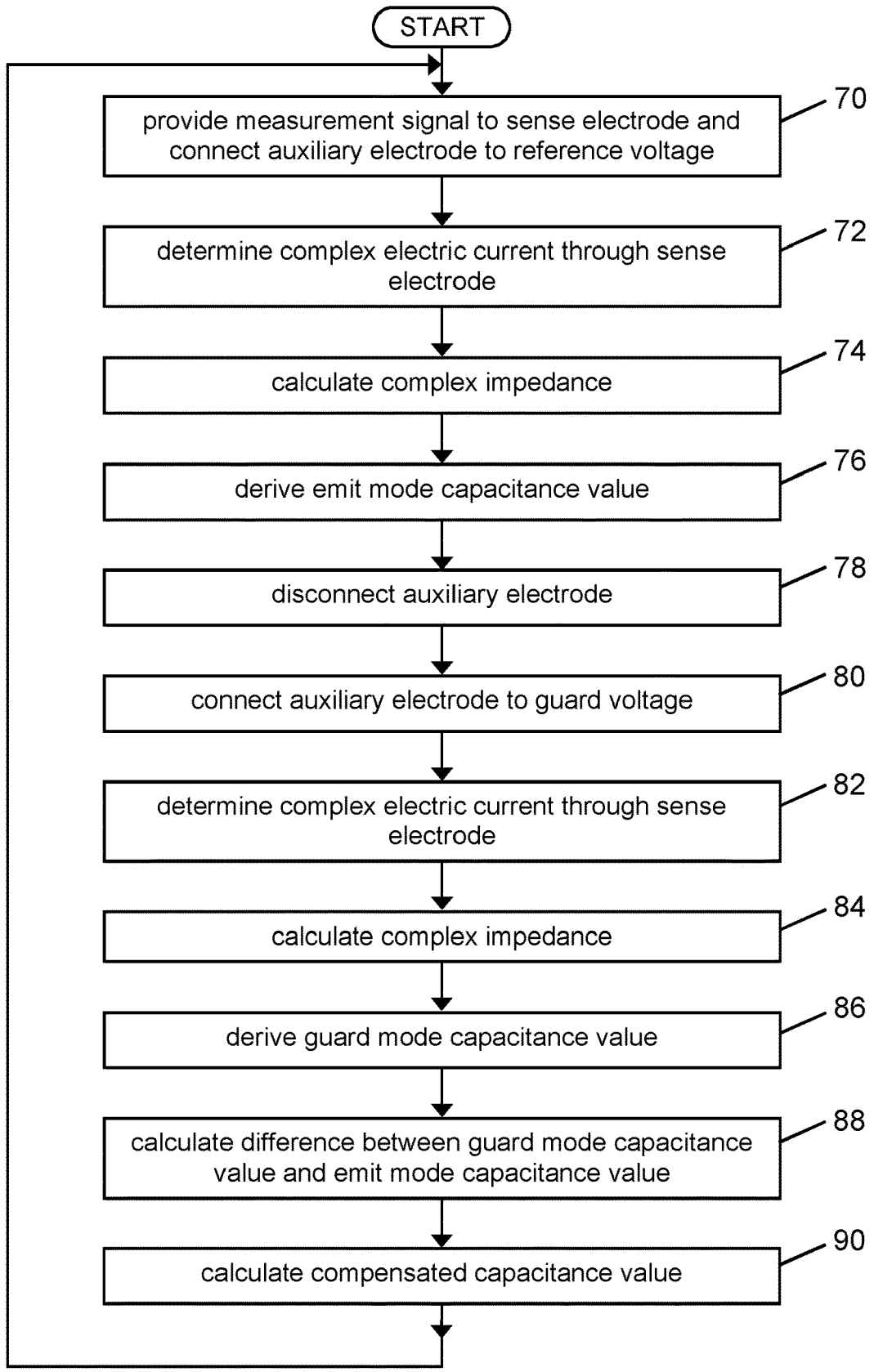
FIG. 8 shows a flow chart of a method in accordance with an embodiment of the invention of operating the capacitive detection system pursuant to FIG. 1 for heater member compensation.

In the following, an embodiment of a method of operating the capacitive detection device 12 pursuant to FIG. 1 will be described with reference to FIG. 1 and FIG. 8, which provides a flowchart of a method. In preparation of operating the capacitive detection device 12, it shall be understood that all involved units and devices are in an operational state and configured as illustrated in FIG. 1.

In order to be able to carry out the method automatically and in a controlled way, the control and evaluation unit 32 comprises a software module 60. The method steps to be conducted are converted into a program code of the software module 60. The program code is implemented in the digital data memory unit 36 of the control and evaluation unit 32 and is executable by the processor unit 34 of the control and evaluation unit 32.

Execution of the method may be initiated by turning on the passenger car ignition. As indicated in FIG. 8, the steps of the method are automatically carried out in a repetitive manner, for instance periodically.

In a first step 70 of the method, by control of the remotely-controllable switching unit 28 through the control and evaluation unit 32, the measurement signal is provided to the sense electrode 16, and the auxiliary electrode 18 is electrically connected to the reference voltage 24, i.e. to AC ground potential. Then, in another step 72, a complex electric current flowing through the sense electrode 16 is determined, and a complex impedance is calculated using the determined complex electric current in a following step 74. The next step 76 is to derive a capacitance value from the calculated complex impedance as an emit mode capacitance value.

In two subsequent steps 78, 80, by control of the remotely-controllable switching unit 28 via the control and evaluation unit 32, the auxiliary electrode 18 electrically is firstly disconnected 78 from the reference voltage 24, and then the auxiliary electrode 18 is electrically connected 80 to the guard voltage. It will of course be appreciated that the two steps 78 and 80 may be performed as a single operation in which the connection of the auxiliary electrode 18 is switched between the reference voltage and the guard voltage so that the auxiliary electrode 18 is electrically connected 80 to the guard voltage.

In another step 82 then, a complex electric current flowing through the sense electrode 16 is determined. In a subsequent step 84, a complex impedance is calculated using the recently determined complex electric current. The next step 86 is to derive a capacitance value from the calculated complex impedance as a guard mode capacitance value.

In a next step 88, the difference between the guard mode capacitance value and the emit mode capacitance value is calculated as a differential loading mode capacitance value. Then, a compensated capacitance value is calculated as a weighted sum of the emit mode capacitance value and the differential loading mode capacitance value in a final step 90. The weighting factors are predefined constant values, which may reside in the digital data memory unit 36 of the control and evaluation unit 32.

The weighting factor for the emit mode capacitance value is chosen to be 1.0. In this specific embodiment of the proposed method, the weighting factor $\alpha$ for the differentially loading mode capacitance value is chosen as the ratio of a value of a capacitance $C_{SSH}$ between the sense electrode 16 and the electric heater member 40 and the value of a capacitance $C_{ESH}$ between the auxiliary electrode 18 and the electric heater member 40:

$$\alpha = \frac{C_{SSH}}{C_{ESH}}$$

The weighting factor $\alpha$ can for instance be determined in a calibration measurement prior to the regular operation of the capacitive detection device 12. A requirement for the maximum tolerable measurement error in determining the capacitances $C_{SSH}$ and $C_{ESH}$ can be derived from the rules for error propagation of relative errors in fractions.

Figure 6:
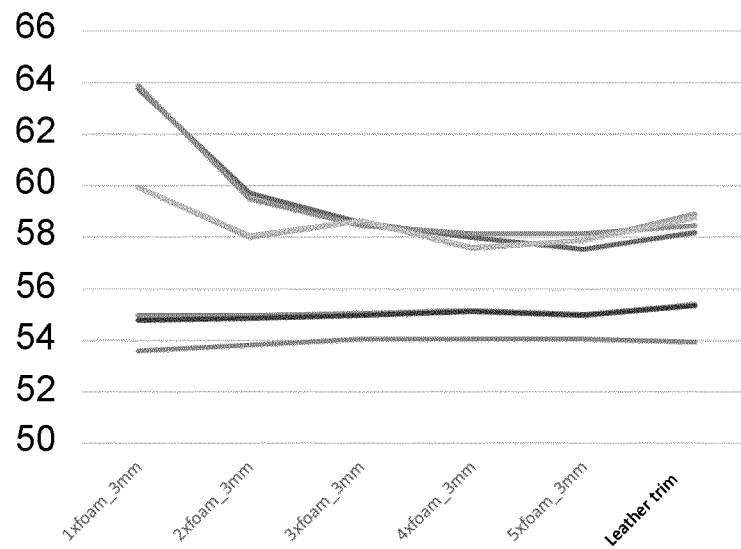
FIG. 6 shows a plot of experimental results from capacitance measurements of the capacitive detection system for various seat occupancy scenarios and at varying thicknesses of interlayers between the heater member and the sense electrode and the auxiliary electrode, respectively, with the heater member being electrically connected to the reference voltage (ground potential)
Figure 7:
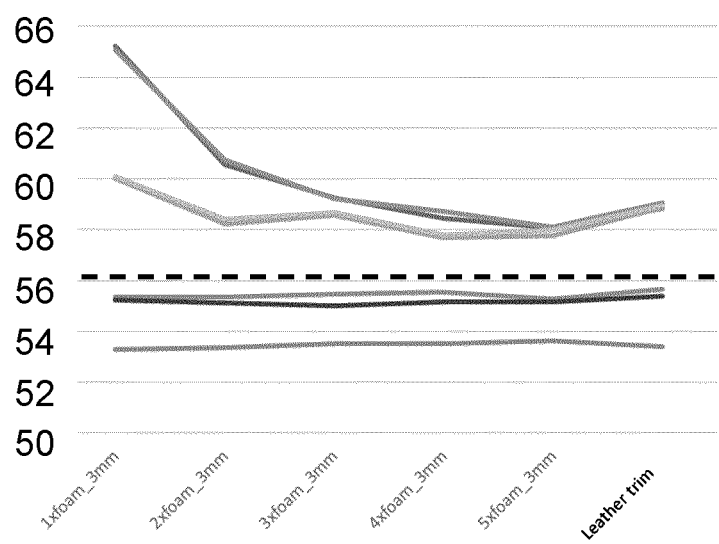
FIG. 7 shows a plot of experimental results from capacitance measurements of the capacitive detection system of the same scenarios and interlayer thicknesses as in FIG. 6, with the heater member electrical connection status being changed to floating potential.

FIGS. 6 and 7 show plots of experimental results from capacitance measurements (in arbitrary units) of the capacitive detection device 12 for various distances of a seat occupant to the heater element and with varying thicknesses of interlayers between the A-surface and the seat occupant (abscissa). For the data of FIG. 6 the heater member 40 was electrically connected to the reference voltage 24 (AC ground potential), while for the data of FIG. 7, the electrical connection status of the heater member 40 was changed to floating potential.

The lowest line in FIGS. 6 and 7 refers to an empty seat. Above are shown two lines referring to a child restraint system at grounded and floating condition, respectively. The four lines above the dashed threshold level line are results for an adult seat occupant.

As can be obtained from FIGS. 6 and 7, the capacitance values determined by the capacitance detection device 12 appear unsusceptible to changes of the electric connection status of the electric heater member 40 between being electrically connected to the reference voltage 24 and being electrically connected to the guard signal. An effective and sufficient electric heater member compensation is achieved, which appropriately fulfills the precondition for incorporating threshold values for reliable and robust detection and/or classification of seat occupancies.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. A capacitive detection device with electric heater member compensation, the capacitive detection device comprising:
   at least one capacitive sensor having at least one electrically conductive sense electrode and at least one electrically conductive auxiliary electrode that are proximal arranged to and mutually insulated from each other, wherein the at least one sense electrode and the at least one auxiliary electrode are arrangeable in the vicinity of an electric heater member,
   a signal voltage source that is configured for providing an alternating measurement voltage with reference to a reference voltage at at least one output port, configured to serve as a measurement signal to be provided to the at least one sense electrode, and a guard signal selectively to be provided to the at least one auxiliary electrode,
   a complex impedance measurement circuit that is electrically connected to the at least one output port, to the at least one sense electrode and to the at least one auxiliary electrode and that is configured for measuring complex sense currents generated in the at least one sense electrode, and for determining a complex impedance based on the measured complex sense current, and is configured to operatively and selectively electrically connect the at least one auxiliary electrode either with the reference voltage or with the guard signal, and
   a control and evaluation unit that is connected to the complex impedance measurement circuit for receiving and evaluating data signals and that is at least configured to control the complex impedance measurement circuit to carry out a complex impedance measurement, for controlling a remotely controllable switching unit for operatively and selectively electrically connecting the at least one auxiliary electrode either with the reference voltage or with the guard signal,
wherein said control and evaluation unit is further configured for executing at least the following steps:
   provide the measurement signal to the at least one sense electrode and electrically connect the at least one auxiliary electrode to the reference voltage,
   determine a complex electric current flowing through the at least one sense electrode,
   calculate a complex impedance using the determined complex electric current and derive a capacitance value as an emit mode capacitance value,
   electrically disconnect the at least one auxiliary electrode from the reference voltage,
   electrically connect the at least one auxiliary electrode to the guard voltage,
   determine a complex electric current flowing through the at least one sense electrode,
   calculate a complex impedance using the determined complex electric current and derive a capacitance value as a guard mode capacitance value,
   calculate the difference between the guard mode capacitance value and the emit mode capacitance value as a differential loading mode capacitance value, and
   calculate a compensated capacitance value as a weighted sum of the emit mode capacitance value and the differential loading mode capacitance value, wherein the weighting factors are predefined constant values.

2. The capacitive detection device as claimed in claim 1, wherein the at least one sense electrode and the at least one auxiliary electrode are arranged in a coplanar manner.

3. The capacitive detection device as claimed in claim 1, wherein the at least one auxiliary electrode surrounds a major portion of the at least one sense electrode.

4. The capacitive detection device as claimed claim 1, wherein the at least one sense electrode has a generally rectangular shape and the at least one auxiliary electrode is designed in the shape of a band and is arranged to run along a major portion of a circumferential length of the at least one sense electrode, in a constantly spaced manner to the at least one sense electrode.

5. The capacitive detection device as claimed in claim 4, wherein the at least one sense electrode and the at least one auxiliary electrode are arrangeable with respect to an electric heater member in the vicinity of the electric heater member such that, seen in at least one direction, at least one portion of the electric heater member extends across the band shape of the at least one auxiliary electrode and further extends over the at least one sense electrode to a substantial part of a linear dimension of the at least one sense electrode.

6. A seat occupancy detection system for detecting an occupancy of an electrically heatable seat, in particular a vehicle seat, the seat occupancy detection system comprising:
   at least one electric heater member, and
   a capacitive detection device as claimed in claim 1, wherein the at least one electric heater member is arranged at a cushion or a backrest forming part of the seat, and the at least one sense electrode and the at least one auxiliary electrode (18) are arranged in the vicinity of the electric heater member.

7. A hands-off detection device for an electrically heatable steering wheel, comprising
   at least one electric heater member, and
   a capacitive detection device as claimed in claim 1, wherein the at least one electric heater member is arranged on a rim of the steering wheel, and the at least one sense electrode and the at least one auxiliary electrode are arranged in the vicinity of an electric heater member.

8. The seat occupancy detection system as claimed in claim 7, wherein at least one electric heater member is arranged such that, seen in at least one direction, at least one portion of the electric heater member extends across the at least one auxiliary electrode and further extends over the at least one sense electrode to a substantial part of a linear dimension of the at least one sense electrode.

9. A method of operating the capacitive detection device as claimed in claim 1 for heater member compensation, the method comprising at least the following steps:
   provide the measurement signal to the at least one sense electrode and electrically connect the at least one auxiliary electrode to the reference voltage,
   determine a complex electric current flowing through the at least one sense electrode, calculate a complex impedance using the determined complex electric current and derive a capacitance value as an emit mode capacitance value,
electrically disconnect the at least one auxiliary electrode from the reference voltage,
electrically connect the at least one auxiliary electrode to the guard voltage,
determine a complex electric current flowing through the at least one sense electrode,
calculate a complex impedance using the determined complex electric current and derive a capacitance value as a guard mode capacitance value,
calculate the difference between the guard mode capacitance value and the emit mode capacitance value as a differential loading mode capacitance value, and
calculate a compensated capacitance value as a weighted sum of the emit mode capacitance value and the differential loading mode capacitance value, wherein the weighting factors are predefined constant values.

10. The method as claimed in claim 9, wherein the weighting factor for the emit mode capacitance value equals one, and the weighting factor for the differential loading mode capacitance value is proportional to a ratio of a value of a capacitance between the at least one sense electrode and an electric heater member and the value of a capacitance between the at least one auxiliary electrode and the electric heater member.

11. A software module for automatically carrying out the method as claimed in claim 9, wherein the method steps to be conducted are converted into a program code of the software module, wherein the program code is implementable in a digital data memory unit of the capacitive detection device or a separate control unit and is executable by a processor unit of the capacitive detection device or a separate control unit.

* * * * *